United States Patent
Imamura et al.

(10) Patent No.: US 10,984,979 B2
(45) Date of Patent: Apr. 20, 2021

(54) CHARGED PARTICLE DETECTOR AND CHARGED PARTICLE BEAM APPARATUS

(71) Applicant: HITACHI HIGH-TECHNOLOGIES CORPORATION, Tokyo (JP)

(72) Inventors: Shin Imamura, Tokyo (JP); Takashi Ohshima, Tokyo (JP); Tomonobu Tsuchiya, Tokyo (JP); Hajime Kawano, Tokyo (JP); Shahedul Hoque, Tokyo (JP); Shunsuke Mizutani, Tokyo (JP); Makoto Suzuki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 33 days.

(21) Appl. No.: 16/475,726

(22) PCT Filed: Jan. 25, 2018

(86) PCT No.: PCT/JP2018/002319
§ 371 (c)(1),
(2) Date: Jul. 3, 2019

(87) PCT Pub. No.: WO2018/143054
PCT Pub. Date: Aug. 9, 2018

(65) Prior Publication Data
US 2019/0355549 A1    Nov. 21, 2019

(30) Foreign Application Priority Data
Jan. 31, 2017 (JP) .............................. JP2017-014978

(51) Int. Cl.
*G01T 1/20*     (2006.01)
*H01J 37/244*   (2006.01)
(Continued)

(52) U.S. Cl.
CPC ........ *H01J 37/244* (2013.01); *G01N 23/2258* (2013.01); *G01T 1/20* (2013.01);
(Continued)

(58) Field of Classification Search
CPC ..... G01N 23/2258; G01T 1/20; G01T 1/2008; G01T 1/24; G01T 1/2018; G01T 1/1644;
(Continued)

(56) References Cited

U.S. PATENT DOCUMENTS 7,910,895 B2   3/2011   Uchiyama et al.
8,502,265 B2 * 8/2013   Tanaka .................. H01L 33/305
                                                          257/103

(Continued)

FOREIGN PATENT DOCUMENTS

JP    11-186593 A     7/1999
JP    2005-298603 A   10/2005
(Continued)

OTHER PUBLICATIONS

International Search Report of PCT/JP2018/002319 dated Apr. 17, 2018.

*Primary Examiner* — Irakli Kiknadze
(74) *Attorney, Agent, or Firm* — Mattingly & Malur, PC (57) ABSTRACT

The disclosure provides a charged particle detector including a scintillator that emits light with stable intensity and obtains high light emission intensity regardless of an energy of an incident electron. The disclosure provides the charged particle detector including: a first light-emitting part (21) in which a layer containing $Ga_{1-x-y}Al_xIn_yN$ (where $0 \le x < 1$, $0 \le y < 1$) and a layer containing GaN are alternately laminated; a second light-emitting part (23) in which the layer containing $Ga_{1-x-y}Al_xIn_yN$ (where $0 \le x < 1$, $0 \le y < 1$) and the layer containing GaN are alternately laminated; and a non-light-emitting part (22) that is interposed between the first
(Continued)

light-emitting part (21) and the second light-emitting part (23) (see FIG. 2).

5 Claims, 6 Drawing Sheets

(51) Int. Cl.
*G01N 23/2258* (2018.01)
*H01J 37/28* (2006.01)
*H01J 49/02* (2006.01)

(52) U.S. Cl.
CPC ............ *H01J 37/28* (2013.01); *H01J 49/025* (2013.01); *H01J 2237/2443* (2013.01)

(58) Field of Classification Search
CPC ....... G01T 1/2023; G01T 1/2985; G21K 4/00; H01J 2237/2443; H01J 37/244; H01J 37/28; H01J 49/025; H01J 49/02; H01J 37/3045; H01J 37/3174; H01J 2237/2445; H01J 2237/28; G01L 1/16; H01L 31/02963; H01L 2924/13091; H01L 2924/181; H01L 2924/00; H01L 2924/00012; H01L 2224/14; H01L 2224/16; H01L 2224/16225; H01L 27/14609; H01L 27/14676; H01L 27/14685; H01L 27/14694; H01L 27/308; H01L 2933/0041; H01L 2933/0058; H01L 33/0093; H01L 33/22; H01L 33/50; H01L 33/54; B82Y 10/00; B82Y 40/00; G03F 9/7046; G03F 9/7076; G03F 9/7084; H05B 45/20; H05B 45/24; H01C 7/105; H01C 7/112; F21K 9/64; G02B 5/0242; G02B 5/0278
USPC ..................................... 250/370.11; 378/98.8
See application file for complete search history.

(56) References Cited

U.S. PATENT DOCUMENTS

| | | | | |
|---|---|---|---|---|
| 9,252,327 | B1* | 2/2016 | Kim | ...................... H01L 25/167 |
| 2008/0308787 | A1* | 12/2008 | Lee | .......................... H01L 33/06 |
| | | | | 257/13 |
| 2013/0099141 | A1* | 4/2013 | Chua | ...................... H01L 33/007 |
| | | | | 250/504 R |
| 2013/0292687 | A1* | 11/2013 | Jiang | ................... H01L 31/1085 |
| | | | | 257/76 |
| 2014/0034985 | A1* | 2/2014 | Pan | ....................... H01L 33/382 |
| | | | | 257/98 |
| 2016/0056325 | A1* | 2/2016 | Maeng | .................. H01L 33/325 |
| | | | | 257/13 |
| 2016/0380155 | A1* | 12/2016 | Jeong | ................ H01L 21/02494 |
| | | | | 257/101 |

FOREIGN PATENT DOCUMENTS

| | | |
|---|---|---|
| JP | 2014-032029 A | 2/2014 |
| JP | 2015-230195 A | 12/2015 |

* cited by examiner

CHARGED PARTICLE DETECTOR AND CHARGED PARTICLE BEAM APPARATUS

TECHNICAL FIELD

The present disclosure relates to a charged particle detector and a charged particle beam apparatus, particularly relates to a charged particle detector having a quantum well structure and a charged particle beam apparatus including the charged particle detector.

BACKGROUND ART

A charged particle beam apparatus, which detects charged particles obtained by irradiating a sample with charged particle beams such as electron beams, includes a detector that detects the charged particles. For example, in a case where electrons emitted from the sample are detected by scanning the sample with the electron beams, the electrons are guided into a scintillator of the detector by applying a positive voltage of about 8 kV to 10 kV, referred to as a post voltage, to the electron detector. Light generated by the scintillator due to collision of the electrons is guided into a light guide, converted into an electric signal by a light-receiving element such as a phototube, and becomes an image signal or a waveform signal.

PTL 1 discloses a scintillator that includes a light-emitting body including an InGaN/GaN quantum well layer formed on a substrate, and describes that provided on the InGaN/GaN quantum well layer are a cap layer, which has a band gap energy larger than that of a constituent material of a nitride semiconductor layer including the InGaN/GaN quantum well layer, and a metal back layer formed of Al on the cap layer.

PTL 2 describes that a cap layer in which a GaN layer is grown is provided on a multi-layered structure in which GaInN and GaN are alternately laminated, and an Al thin film for preventing charging during incidence of electrons is vapor-deposited on the cap layer.

PRIOR ART LITERATURE

Patent Literature

PTL 1: JP-A-2005-298603 (corresponding to U.S. Pat. No. 7,910,895)
PTL 2: JP-A-2014-32029

SUMMARY OF INVENTION

Technical Problem

The scintillator having the quantum well layer formed of the laminated layer of InGaN and GaN as described in PTL 1 and PTL 2 has a characteristic that light emission intensity increases as an energy of the incident electrons increases. This is because the higher the energy of the electrons, the deeper penetration depth into the scintillator, and the light emission intensity changes in accordance with the penetration depth. Meanwhile, based on irradiation on the sample with the electron beams, the electrons emitted from the sample include those having various energies (acceleration voltage). High detection sensitivity can be achieved by highly efficiently detecting such electrons having various energies, but the light emission intensity changes in accordance with the characteristic of the scintillator, apparatus conditions (for example, an arrival energy of the electron beams with which the sample is irradiated) and a degree of charge-up of the sample. In particular, since high measurement reproducibility is required in an apparatus that measures and inspects a semiconductor device, the scintillator that emits light with stable intensity is desired regardless of the change in the energy of the electrons emitted from the sample.

Hereinafter, provided are a charged particle detector and a charged particle beam apparatus, which include a scintillator intended to emit light with stable intensity and to obtain high light emission intensity regardless of an energy of incident electrons.

Solution to Problem

As one aspect to achieve the above object, provided is a charged particle detector detects a charged particle obtained by irradiating a sample with a charged particle beam. The charged particle detector includes: a first light-emitting part in which a layer containing $Ga_{1-x-y}Al_xIn_yN$ (where $0 \leq x<1$, $0 \leq y<1$) and a layer containing GaN are alternately laminated; a second light-emitting part in which the layer containing $Ga_{1-x-y}Al_xIn_yN$ (where $0 \leq x<1$, $0 \leq y<1$) and the layer containing GaN are alternately laminated; and a non-light-emitting part that is interposed between the first light-emitting part and the second light-emitting part.

Advantageous Effect

According to the above configuration, light emission is performed with stable intensity and high light emission intensity can be obtained regardless of an energy of incident electrons.

DESCRIPTION OF EMBODIMENTS

In recent years, demands are increasing for high definition, low noise, and throughput improvement in semiconductor device measurement and inspection. In order to meet these demands, it is desired to reduce detection time and improve detection sensitivity. It is necessary to increase a response speed of a scintillator.

Meanwhile, in an apparatus that measures dimensions of an object with high accuracy such as a length measurement SEM (CD-SEM: Critical Dimension-Scanning Electron Microscope), an image may be distorted and length measurement accuracy may be reduced when a sample is charged up. In order to implement measurement and inspection with high accuracy, a scanning speed of electron beams is increased, and time required for displaying one screen is shortened, so that charge-up can be reduced. Scanning is performed at a high speed, so that irradiation amount of beams per unit area is reduced, and the number of electrons emitted from the sample is also reduced. Thus, a scintillator with a high response speed and high sensitivity is required.

A need for observing a three-dimensional uneven structure increases particularly in a semiconductor structure. For that purpose, it is effective to detect secondary electrons (SE) and backscattered electrons (BSE) directly above the sample. Since an emission direction of the BSE changes in accordance with a pattern shape, information on unevenness of the sample can be obtained.

Meanwhile, a detector (scintillator) is disposed on an orbit of the BSE or the like emitted from the sample, so that the BSE or the like can be directly detected. For example, in a case where the detector that directly detects the BSE or the like is disposed on an electron microscope that performs irradiation with low-acceleration electron beams, the BSE of 4 kV to 5 kV is incident on the scintillator, but light emission of the scintillator is weak at about 4 kV to 5 kV or less, and a good image cannot be obtained. In a case where the BSE that passes near an optical axis of the electron beams is detected, it is difficult to apply a post voltage of 8 kV to 10 kV that causes the light to be emitted efficiently by the scintillator.

In a charged particle beam apparatus such as the SEM, it is necessary to detect the secondary electrons and the backscattered electrons directly above the sample. When the backscattered electrons whose orbit changes in accordance with the shape of the sample are detected, information on the unevenness of the sample can be obtained. There is an advantage that it is not necessary to install a mechanism that adjusts the orbit of the electrons by disposing the detector on the orbit of the backscattered electrons emitted from the sample.

However, as described above, it is difficult for the scintillator to obtain sufficient light emission intensity at an energy of 5 kV or less. Particularly in a low-acceleration energy range, the light emission intensity greatly changes in accordance with a change in the energy. Thus, brightness changes in accordance with the acceleration energy, and it may be difficult to maintain high measurement accuracy.

Hereinafter, description is made in more details for a detector and a charged particle beam apparatus, which include a scintillator capable of obtaining stable and high light emission intensity regardless of the change in the energy based on penetration of low-energy electrons.

Hereinafter, description is made for a high-speed scintillator structure, a detector having the scintillator structure and a charged particle beam apparatus including the detector. With regards to the high-speed scintillator structure, a plurality of light-emitting layers are disposed, and a non-light-emitting layer is disposed between the light-emitting layers, so that low-energy electrons can be detected, a change in brightness due to the change in the energy of the incident electrons is little, stable measurement is possible, and speed and sensitivity are high. Description is made for a charged particle beam apparatus and a charged particle detector including a scintillator structure. In the scintillator structure, a non-light-emitting layer formed of, for example, only a layer of GaN is disposed between two or more light-emitting layers mainly formed of laminated layers of an InGaN layer and a GaN layer. According to such a configuration, the change in the brightness due to a difference in the energy of the incident electrons can be prevented, and high light emission intensity can be obtained.

Hereinafter, the charged particle beam apparatus including the detector that uses the scintillator as a detection element is described with reference to the drawings. An electron microscope, particularly a scanning electron microscope, is described as the charged particle beam apparatus, but the invention is not limited thereto. Embodiments described below can also be applied to other charged particle beam apparatuses such as a scanning ion microscope that uses ion beams. The invention is also applicable to a measurement apparatus, an inspection apparatus, and an observation apparatus of a semiconductor pattern that uses the scanning electron microscope.

The term "scintillator" used in this description refers to an element that emits light by incidence of charged particle beams. The scintillator in this description is not limited to the scintillator shown in the embodiments, and may have various shapes and structures.

Figure 1:
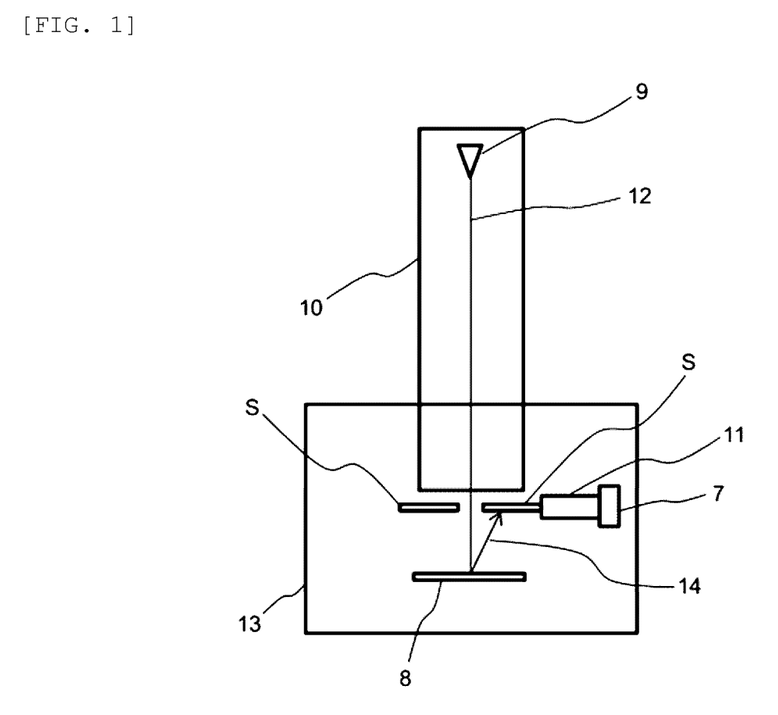
FIG. 1 is a diagram showing a basic configuration of an electron microscope.

FIG. 1 is a diagram showing a basic configuration of the electron microscope. A sample 8 is irradiated with a primary electron beam 12 emitted from an electron source 9, and a secondary particle 14 such as a secondary electron or a reflected electron is emitted. The secondary particle 14 is drawn in and is incident on a scintillator S. When the secondary particle 14 is incident on the scintillator S, the light emission occurs in the scintillator S. The light emitted from the scintillator S is guided by a light guide 11, and a light-receiving element 7 converts the light into an electric signal. Hereinafter, the scintillator S, the light guide 11, and the light-receiving element 7 may be collectively referred to as a detection system. A light-receiving element using a photomultiplier tube or a semiconductor can be used as the light-receiving element 7. The light-receiving element 7 may be disposed at any position as long as light emission of the scintillator S can be input thereto. The light-receiving element 7 is disposed in a sample chamber 13 in FIG. 1, but the light-receiving element 7 can be placed outside the sample chamber 13. The light is input from the scintillator S to the light-receiving element 7 using the light guide in FIG. 1, but can be input by other methods or other dispositions.

A signal obtained by the light-receiving element 7 is converted into an image corresponding to an electron beam irradiation position and the image is displayed. An electron optical system for focusing the primary electron beam 12 and irradiating the sample with the primary electron beam 12, that is, a deflector, a lens, a diaphragm, and an objective lens are not shown. An electron optical lens barrel 10 is disposed in the electron optical system. The sample 8 is placed on a sample stage so as to be in a movable state. The sample 8 and the sample stage are disposed in the sample chamber 13. Generally, the sample chamber 6 is kept in a vacuum state at the time of electron beam irradiation. The electron microscope is connected to a control unit that controls the operation of all components and each component, a display unit that displays an image, and an input unit through which a user inputs an operation instruction of the electron microscope, but the control unit, the display unit and the input unit are not shown.

The electron microscope is an example of the configuration, and other configurations can be applied as long as it is an electron microscope including the scintillator. The secondary particle 7 also includes a transmission electron and a scanning transmission electron. Only one detector is shown for the sake of simplicity, but a detector for reflected electron detection and a detector for secondary electron detection may be provided separately, and a plurality of detectors may be provided to distinguish and detect an azimuth angle or an elevation angle. FIG. 1 shows an example in which the scintillator S is disposed as an opening forming member that forms an opening which enables a beam to pass through, but the same effect can be also obtained by other dispositions.

Figure 2:
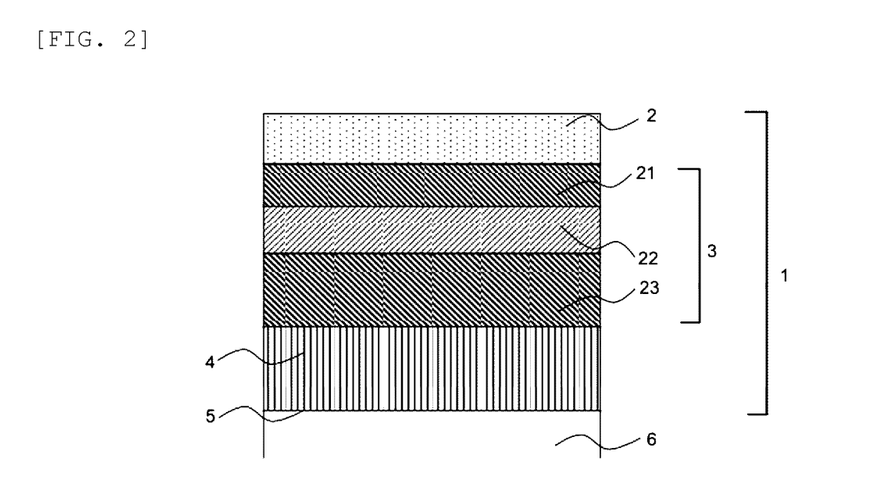
FIG. 2 is a diagram showing a configuration of a scintillator.

Hereinafter, a specific configuration of the scintillator is described. FIG. 2 is a schematic view showing the scintillator S according to a first embodiment. A material of a scintillator light-emitting part 1 uses a light-emitting element that has a quantum well structure containing GaN.

As a structure and a manufacturing method of the scintillator light-emitting part 1 according to the first embodiment, a GaN buffer layer 4 is grown on a sapphire substrate 6, and a large number of layers are grown on the GaN buffer layer 4 to form a quantum well structure 3 by changing the composition of a layer containing $Ga_{1-x-y}Al_xIn_yN$ (where $0 \leq x < 1$, $0 \leq y < 1$). An Al layer is formed as a conductive layer 2 on the quantum well structure 3. The Al layer 2 is formed on a side to which a charged particle to be detected is incident in the charged particle beam apparatus. As a material of the conductive layer 2, materials other than Al or alloys can be used as long as it is a conductive material. A thickness of the conductive layer 2 needs to be adjusted in accordance with an energy of the charged particle beam. For example, in a case where the material is Al and the charged particle to be detected is an electron beam of 3 kV to 12 kV, it is desired that the thickness of the conductive layer 2 is adjusted in a range of 30 nm to 1000 nm.

The sapphire substrate 6 has a disc shape having an φ of 2 inches. A thickness c of the buffer layer is grown to a thickness in a range of 3 μm to 10 μm.

The quantum well structure 3 includes at least three or more layers shown below. The quantum well structure 3 includes: a light-emitting layer 21 in which a quantum well layer having a composition of $Ga_{1-x-y}Al_xIn_yN$ and a barrier layer having a composition of GaN alternately overlap one cycle or more; a non-light-emitting layer 22 that has a composition of, for example, GaN and is disposed directly below the light-emitting layer 21; and a light-emitting layer 23 that is disposed directly below the non-light-emitting layer 22 and in which a quantum well layer having a composition of $Ga_{1-x-y}Al_xIn_yN$ and a barrier layer having a composition of GaN alternately overlap one cycle or more.

Figure 3:
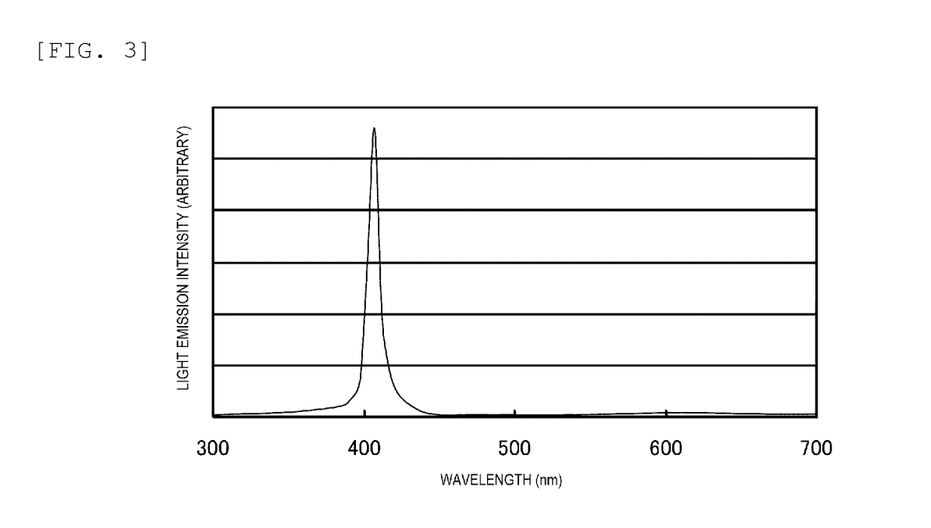
FIG. 3 is a diagram showing an emission spectrum of the scintillator.

The thickness of each of the light-emitting layer 21, the non-light-emitting layer 22, and the light-emitting layer 23 is in a range of 10 nm to 1000 nm, and the thickness of each layer may be different. Regarding the structure, the conductive layer 2 is formed by vapor deposition at a thickness in a range of 40 nm to 200 nm, so as to prevent charging at the time of electron incidence. Then, the layers are cut out to a predetermined size and used as the scintillator. FIG. 3 shows an example of a light emission spectrum of the scintillator described above.

The thicknesses and the compositions of the quantum well layer and the barrier layer can be appropriately selected as necessary. An interface 5 between the light-emitting part 1 and the sapphire substrate 6 may be a flat surface, and may be an uneven structure. For example, when a protruding structure having a structure pitch of 10 nm to 10000 nm and a structure height of 10 nm to 10000 nm is continuously formed, it is effective to improve light emission output by light emission extraction. A plurality of non-light-emitting layers 22 can be formed in the quantum well layer 3, and the thickness and the number of the light-emitting layers 21, 23 can also be increased.

Here, a new effect is found between the layer thicknesses of the light-emitting layers 21, 22, and the non-light-emitting layer 22, and voltage dependence of the light emission intensity. Due to a voltage applied and accelerated, the energy of the charged particle beam is changed, and a penetration depth of the charged particle beam into the scintillator is changed. Generally, when the applied voltage is high, the charged particle beam reaches a portion having a large thickness; when the applied voltage is low, the charged particle beam reaches only a portion having a small thickness.

Figure 5:
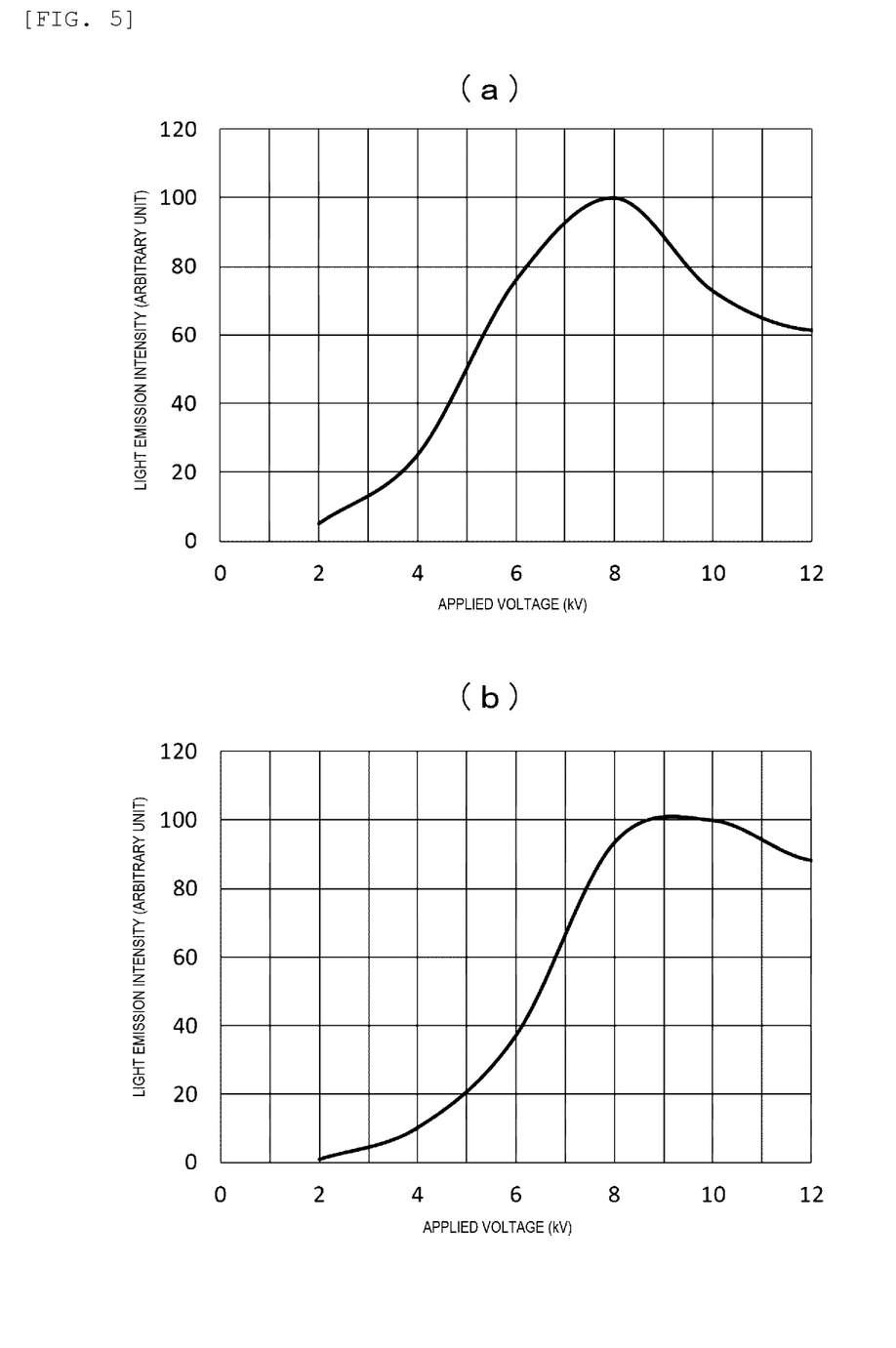
FIG. 5 is a diagram showing a relationship between an incident energy (applied voltage) of an electron and light emission intensity of the scintillator.

FIG. 5(a), as a comparative example, shows a light emission characteristic of a scintillator in which only a portion that corresponds to the light-emitting layer 21 and has a thickness of 50 nm is formed directly below the conductive layer 2. FIG. 5(a) shows dependence of the light emission intensity in a case where irradiation is performed with an electron beam as the charged particle beam, and an applied voltage that accelerates the electron beam is changed at 2 kV to 12 kV. When the applied voltage is around 8 kV, the light emission intensity is large; when the applied voltage is about 8 kV, a change in the light emission intensity due to a change in the applied voltage is small. However, when the applied voltage is 9 kV or more, the light emission intensity decreases, and there is a sharp change. This is because, when the applied voltage is high, since the thickness of the light-emitting layer directly below the conductive layer 2 is 50 nm, the energy of the charged particle is too high and passes through the relatively shallow light-emitting layer, and energy propagation to the scintillator is not sufficient, thus reducing the light emission intensity.

When the applied voltage is 6 kV or less, the light emission intensity also sharply decreases. This is because the energy of the charged particle beam that reaches the light-emitting layer decreases, and the energy propagated to the scintillator decreases.

FIG. 5(b), as a comparative example, shows a light emission characteristic of a scintillator in which a non-light-emitting GaN layer is disposed directly below the conductive layer 2, and only a portion that corresponds to the light-emitting layer 23 and has a thickness of 100 nm is formed from a depth of 100 nm. FIG. 5(b) shows dependence of the light emission intensity in a case where irradiation is performed with an electron beam as the charged particle beam and an applied voltage that accelerates the electron beam is changed at 2 kV to 12 kV. When the applied voltage is in a range of 8 kV to 12 kV, the light emission intensity is large, and a change in the light emission intensity caused by the applied voltage is relatively small and in a flat range. However, when the applied voltage is 7 kV or less, the light emission intensity decreases, and there is a sharp change. This is because the light-emitting layer is at a relatively deep portion, so that the energy of the charged particle beam that reaches the light-emitting layer decreases, and the energy propagated to the scintillator decreases.

Accordingly, in a case where the light-emitting layer is a continuous layer, it is shown that the range of the applied voltage is quite narrow, which is a flat portion with small change in the light emission intensity caused by the change in the applied voltage. The inventors find that, by inserting the non-light-emitting layer 22 between the light-emitting layers, the range of the applied voltage is greatly increased, which is a flat portion with small change in the light emission intensity.

Figure 6:
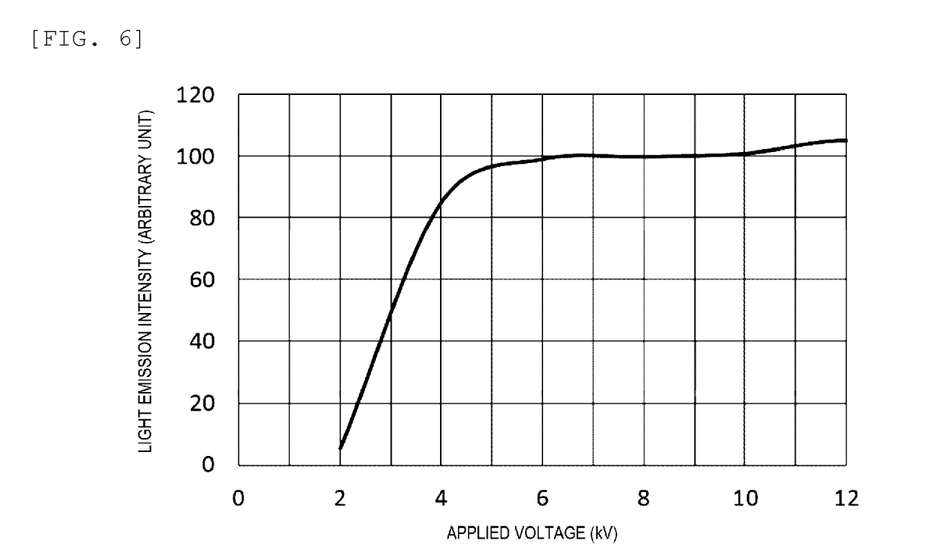
FIG. 6 is a diagram showing the relationship between an incident energy (applied voltage) of an electron and light emission intensity of the scintillator.

FIG. 6 is a diagram showing a light emission characteristic of a quantum well structure in which a non-light-emitting layer is disposed between light-emitting layers. The present embodiment shows a light emission characteristic of a scintillator in which the light-emitting layer 21 having a thickness of 10 nm to 50 nm is formed directly below the conductive layer 2, the non-light-emitting GaN layer 22 having a thickness of 20 nm to 100 nm is formed directly below the light-emitting layer 21, and the light-emitting layer 23 having a thickness of 100 nm to 500 nm is formed directly below the non-light-emitting GaN layer 22. FIG. 6 shows dependence of the light emission intensity in a case where irradiation is performed with an electron beam as the charged particle beam and an applied voltage that accelerates the electron beam is changed at 2 kV to 12 kV. It is shown that when the applied voltage is in a wide range of 4 kV to 12 kV, the light emission intensity is large, and a change in the light emission intensity caused by the applied voltage is relatively small and in a flat range. The structure shown here is an example. When at least one non-light-emitting GaN layer 22 is inserted, an effect of the disclosure can be obtained even in a case of another layer thickness or another structure.

Figure 7:
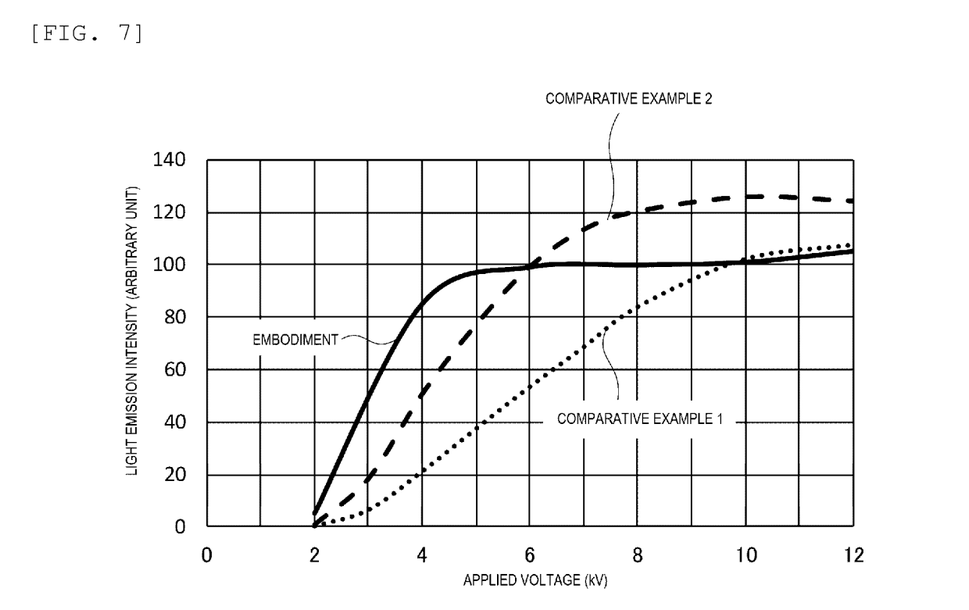
FIG. 7 is a diagram showing the relationship between an incident energy (applied voltage) of an electron and light emission intensity of the scintillator.

FIG. 7 shows light emission characteristics of a quantum well structure in which the non-light-emitting layer is interposed between the light-emitting layers and of other comparative examples respectively. FIG. 7 shows dependence of the light emission intensity in a case where irradiation is performed with an electron beam as the charged particle beam and an applied voltage that accelerates the electron beam is changed at 2 kV to 12 kV. A characteristic of the present embodiment having a structure same as the above is compared with that of a first comparative example having only a light-emitting layer of 200 nm directly below the conductive layer 2 and that of a second comparative example having only a light-emitting layer of 400 nm directly below the conductive layer 2. When the applied voltage is in a range of 2 kV to 8 kV, the comparative examples 1, 2 show a sharp change in the light emission intensity, and have a narrow flat portion. Accordingly, even when the thickness of the light-emitting layer is changed, the sharp change occurs as long as there is only the light-emitting layer. Meanwhile, in the present embodiment, the flat portion indicating the change in the light emission intensity is obtained when the applied voltage is in a wide range of 4 kV to 12 kV.

As a result of a study by the inventors, the thickness of all the light-emitting layers may be in a range of 30 nm to 10000 nm depending on the type of the charged particle beam. In this case, the thickness of the non-light-emitting layer 22 may be in a range of 10 nm to 5000 nm. Inventers find that it is particularly effective when the thickness of all the light-emitting layers is 50 nm to 1000 nm, and the thickness of the non-light-emitting layer 22 is in a range of 20 nm to 500 nm. A characteristic in which the change in the light emission intensity is flat when the applied voltage is in the range of 4 kV to 12 kV is particularly effective for a detector of the secondary electron and the reflected electron in the electron microscope or the like. The energy of the reflected electron changes in accordance with the energy of the primary electron beam, an observation target, and an irradiation position. Particularly, observation of the reflected electron is important when the applied voltage is in the range of 4 kV to 12 kV. However, when the light emission intensity greatly changes due to electrons having various energies, the light emission intensity changes even when incidence amounts of the electrons are the same, and accuracy for correctly measuring the incidence amount is lowered. This causes, for example, unnecessary contrast or screen shade in an image, which hinders correct observation. Accordingly, the disclosure is highly effective for improving measurement accuracy and image quality of the charged particle beam apparatus. Therefore, the charged particle apparatus that uses the detector including the scintillator according to the disclosure can obtain good characteristics.

In the configuration of the present embodiment, in the light-emitting layer 21 located directly below the conductive layer 2, a layer in contact with the conductive layer 2 may have a composition of $Ga_{1-y}In_yN$ (where $0<y<1$). In this case, a layer containing In is disposed directly below the Al layer, so that conductivity is higher than that of the GaN layer, and a band gap is small. Thus, the electron flows into the Al layer easily. Therefore, the electron incident on the quantum well structure 3 can immediately move to the Al layer. The Al layer is disposed as a conductor, and the electron is removed without remaining in the scintillator light-emitting part 1.

In a case where the electron incident on the quantum well structure 3 is not immediately removed, the remaining electron becomes a negative charge, acts as a repulsive force to the electron incident thereafter, reduces the incidence amount of the electron, and causes a decrease in light emission output. In addition, the remaining electron causes delayed light emission in which light is emitted a little later after incidence, which causes a reduction in the speed of light emission.

Figure 4:
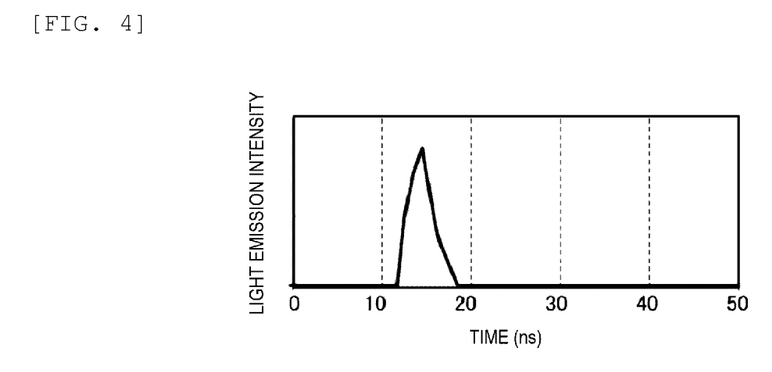
FIG. 4 is a diagram showing a change in light emission intensity of a quantum well layer with respect to a time change.

According to the above configuration, the electron after the incidence is immediately removed, so that an increase in the light emission output and an increase in the speed of the light emission can be obtained. FIG. 4 shows a result of evaluating a change in the light emission output after the incidence in the scintillator of the present embodiment at an extremely high speed in unit of ns. It can be seen from FIG. 4 that the light emission disappears at 10 ns or less after increasing. This is one reason why the remaining electron is immediately removed.

When the decay time of the light emission is long, an incidence interval of the electron cannot be shortened, and measurement cannot be performed at a high speed. In the present embodiment, the decay time is very short, and the measurement can be performed at a high speed. Accordingly, it is shown that a response characteristic of the light in the present embodiment is significantly quicker than those of the comparative examples. With the configuration uses the detector including the scintillator, a high-performance charged particle beam detector capable of performing scanning at a high speed can be obtained.

However, in the present embodiment, the position directly below the conductive layer 2 may be alternatively provided with a GaN layer or a layer containing another composition. Even in such a case, the above-described effects can be obtained.

Figure 8:
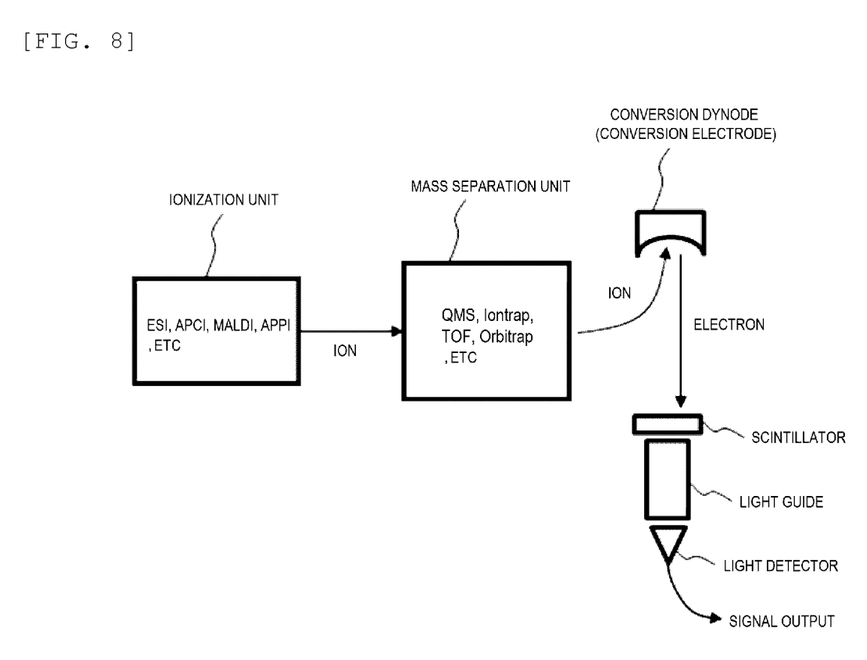
FIG. 8 is a diagram showing a configuration of a mass analysis apparatus.

The above description is mainly given as an example in which the scintillator is applied to the detector of the scanning electron microscope, or the like, but the scintillator described above may be adopted as a detector of a mass analysis apparatus. FIG. 8 is a diagram describing a configuration of the mass analyzer. The mass analysis apparatus performs mass separation on an ion by the electromagnetic action, and measures a mass/charge ratio of the ion to be measured. A mass separation unit may be of a QMS type, an iontrap type, a time flight (TOF) type, an FT-ICR type, an Orbitrap type, or a type that combines those types. The mass analysis apparatus shown in FIG. 8 causes the ion mass-selected in the mass separation unit to collide with a conversion electrode called a conversion dynode, converts the ion into a charged particle, detects the generated charged particle in a scintillator, and detects the emitted light, thereby obtaining signal output. The above-described scintillator is applied as the scintillator of the mass analysis apparatus shown in FIG. 8, so that a mass analysis apparatus capable of performing high-speed and high-sensitivity analysis can be provided.

REFERENCE SIGN LIST 1 scintillator light-emitting part
2 conductive layer
3 quantum well structure
4 buffer layer
5 interface between light-emitting part and substrate
6 substrate
7 light-receiving element
8 sample
9 electron source
10 electron optical lens barrel
11 light guide
12 primary electron beam
13 sample chamber
14 secondary electron beam
21 light-emitting layer
22 non-light-emitting layer
23 light-emitting layer

The invention claimed is:

1. A charged particle detector that detects a charged particle obtained by irradiating a sample with a charged particle beam, the charged particle detector comprising:
a light emitting structure on which a charged particle to be detected is incident, including
a first light-emitting part in which a layer containing $Ga_{1-x-y}Al_xIn_yN$ (where 0≤x<1, 0≤y<1) and a layer containing GaN are alternately laminated;
a second light-emitting part in which a layer containing $Ga_{1-x-y}Al_xIn_yN$ (where 0≤x<1, 0≤y<1) and a layer containing GaN are alternately laminated; and
a non-light-emitting part that is interposed between the first light-emitting part and the limitation the second light-emitting part, wherein the non-emitting part is a layer containing GaN that is thicker than one GaN layer included in the first and second light-emitting parts.

2. The charged particle detector according to claim 1, wherein
a total thickness of a portion including the first light-emitting part, the second light-emitting part, and the non-light-emitting part is 30 nm to 10000 nm, and a thickness of the non-light-emitting part is 10 nm to 5000 nm.

3. The charged particle detector according to claim 1, wherein
a total thickness of a portion including the first light-emitting part, the second light-emitting part, and the non-light-emitting part is 50 nm to 1000 nm, and a thickness of the non-light-emitting part is 20 nm to 500 nm.

4. A charged particle beam apparatus comprising:
a charged particle detector that detects a charged particle obtained by irradiating a sample with a charged particle beam, wherein
the charged particle detector comprising a light emitting structure on which a charged particle to be detected is incident, including:
a first light-emitting part in which a layer containing $Ga_{1-x-y}Al_xIn_yN$ (where 0≤x<1, 0≤y<1) and a layer containing GaN are alternately laminated;
a second light-emitting part in which the layer containing $Ga_{1-x-y}Al_xIn_yN$ (where 0≤x<1, 0≤y<1) and the layer containing GaN are alternately laminated; and
a non-light-emitting part that is interposed between the first light-emitting part and the limitation the second light-emitting part, wherein the non-emitting part is a layer containing GaN that is thicker than one GaN layer included in the first and second light-emitting parts.

5. A mass analysis apparatus comprising:
a mass separation unit that performs mass separation on an ion; and
a detector that detects the ion separated by the mass separation unit, wherein
the detector comprises a light emitting structure on which an ion to be detected is incident, including:
a first light-emitting part in which a layer containing $Ga_{1-x-y}Al_xIn_yN$ (where 0≤x<1, 0≤y<1) and a layer containing GaN are alternately laminated;
a second light-emitting part in which a layer containing $Ga_{1-x-y}Al_xIn_yN$ (where 0≤x<1, 0≤y<1) and a layer containing GaN are alternately laminated; and
a non-light-emitting part that is interposed between the first light-emitting part and the limitation the second light-emitting part, wherein the non-emitting part is a layer containing GaN that is thicker than one GaN layer included in the first and second light-emitting parts.

* * * * *